(12) United States Patent
Moore et al.

(10) Patent No.: US 8,605,414 B2
(45) Date of Patent: Dec. 10, 2013

(54) DISASTER RESISTANT SERVER ENCLOSURE WITH COLD THERMAL STORAGE DEVICE AND SERVER COOLING DEVICE

(76) Inventors: Robby Jay Moore, Auburn, CA (US); John Arthur Hendricks, Sylvania, OH (US)

(*) Notice: Subject to any disclaimer, the term of this patent is extended or adjusted under 35 U.S.C. 154(b) by 199 days.

(21) Appl. No.: 13/199,930

(22) Filed: Sep. 12, 2011

(65) Prior Publication Data

US 2012/0087085 A1 Apr. 12, 2012

Related U.S. Application Data

(60) Provisional application No. 61/403,273, filed on Sep. 13, 2010.

(51) Int. Cl.
| | |
|---|---|
| G06F 1/16 | (2006.01) |
| G06F 1/20 | (2006.01) |
| H05K 5/00 | (2006.01) |
| H05K 7/00 | (2006.01) |

(52) U.S. Cl.
USPC .......................... 361/679.02; 361/679.47

(58) Field of Classification Search
USPC ............... 361/679.46–679.54, 679.02
See application file for complete search history.

(56) References Cited

U.S. PATENT DOCUMENTS

| | | | |
|---|---|---|---|
| 6,301,108 B1* | 10/2001 | Stockbridge ................. 361/688 |
| 7,211,742 B2* | 5/2007 | Moore et al. ................. 174/539 |
| 7,291,784 B2* | 11/2007 | Moore et al. ................. 174/50 |
| 7,545,639 B2* | 6/2009 | Ridge .......................... 361/690 |
| 7,703,291 B2* | 4/2010 | Bushnik et al. ............... 62/3.2 |
| 2004/0064631 A1* | 4/2004 | Kishon et al. ................ 711/100 |
| 2005/0057849 A1* | 3/2005 | Twogood et al. ........... 360/97.02 |
| 2005/0068666 A1* | 3/2005 | Albrecht et al. ............ 360/97.02 |
| 2005/0286225 A1* | 12/2005 | Moore et al. ................. 361/695 |
| 2007/0017685 A1* | 1/2007 | Moore et al. ............. 174/17 VA |
| 2008/0055846 A1* | 3/2008 | Clidaras et al. .............. 361/687 |
| 2008/0175983 A1* | 7/2008 | Moore ........................ 427/96.6 |
| 2008/0310096 A1* | 12/2008 | Sandesara et al. ............ 361/685 |
| 2009/0021897 A1* | 1/2009 | Katzenberger et al. ....... 361/679 |
| 2009/0050365 A1* | 2/2009 | Moore et al. ................. 174/547 |
| 2009/0168345 A1* | 7/2009 | Martini ........................ 361/691 |
| 2009/0219679 A1* | 9/2009 | Moore et al. ............. 361/679.31 |
| 2010/0223085 A1* | 9/2010 | Gauthier et al. ................. 705/8 |
| 2011/0017747 A1* | 1/2011 | Wildman et al. ......... 220/560.01 |
| 2011/0083824 A1* | 4/2011 | Rogers ........................ 165/80.2 |

\* cited by examiner

*Primary Examiner* — Adrian S Wilson
(74) *Attorney, Agent, or Firm* — Bruce H Johnsonbaugh

(57) ABSTRACT

A disaster resistant server enclosure is provided. A fire resistant outer enclosure is provided, and may be made of gypsum. A water resistant, thermally conductive container is mounted within the outer enclosure. A server is mounted within the water resistant container. A cold thermal storage device, such as a block of ice, is also mounted within an insulating cover inside said outer enclosure. When a fire is sensed outside the outer enclosure, an actuator thermally connects the cold thermal storage device to the water resistant container to cool the server during the fire.

3 Claims, 4 Drawing Sheets

DISASTER RESISTANT SERVER ENCLOSURE WITH COLD THERMAL STORAGE DEVICE AND SERVER COOLING DEVICE

CROSS REFERENCE TO RELATED APPLICATION

This application claims the benefit of and priority from U.S. provisional application Ser. No. 61/403,273 filed on Sep. 13, 2010.

BACKGROUND

The worldwide data contained on computer servers everywhere is compounding at an incredible rate. The world's data is growing up to 10× every 5 years and shows no sign of slowing down. 70 to 80 percent of the world's data is at risk of loss due to natural disaster and will continue to be vulnerable well into the future. The growth of data storage in many cases exceeds the growth rate of internet bandwidth causing a glut of data to typically remain wherever it's created resulting in a persistent vulnerability of the data. Data loss worldwide continues to be a problem despite the ability to stream data offsite or physically move data storage offsite for disaster protection. The hundreds of business which close every year do so as a result of lack of simple disaster planning before a fire, hurricane, earthquake or flood. Pervasive data loss from natural disaster can be dramatically reduced if the data storage device can withstand the elements of a typical natural disasters.

The invention disclosed herein will teach techniques to protect any common commercially available data storage device or server from natural disaster. In essence, this invention concerns creating the equivalent of a paper fire safe but for digital servers containing data. As most of the world's data is now digital, this invention is incredibly important for the protection of vulnerable data everywhere. As will be taught in this disclosure, balancing fire protection, water protection, heat dissipation and cost are critical to creating a viable solution for today's data storage requirements. Small businesses, government offices and remote enterprise offices everywhere will benefit from near zero data loss and significant cost savings from this invention.

Servers contain critical data including but not limited to databases, photos, surveillance video, business data and/or electronic records. Typically, server data is actively being modified making data backup and disaster protection complicated, as synchronous replication to a second location can be technically difficult and expensive. Two synchronous servers, connected to the same network but located geographically far apart, will be delayed by a minimum time equal to the distance between the servers divided by the speed of light. As a consequence, synchronous servers may be low performing and slow to react from an end user's point of view.

Asynchronous replication is the often deployed to increase performance and improve the experience to the end user. The downside of this is that data on the server is left vulnerable to natural disaster for the time it takes to back it up over the Internet or physically move it offsite away from the main data storage location. This vulnerability window can vary from milliseconds to days or weeks of vulnerability to loss due to natural disaster such as earthquakes, hurricanes, fires or floods. The critical nature of the data combined with governmental regulations to protect and safeguard the data (such as the Healthcare Information Portability and Accountability Act, i.e. HIPAA) can create backup and disaster recovery issues for the owner of the data. Failure to protect the data and thus comply with government regulations can result in hundreds of thousands of dollars in fines. Failure to protect critical video surveillance data lost in a disaster such as arson fire can hinder investigations to how or who caused the fire as the evidence is consumed in the fire itself. Failure to protect precious family photos or video data can result in emotional losses that go beyond pure financial impacts.

Previous attempts to create disaster proof server cabinets, racks or enclosures have resulted in high cost, low performance, inefficient heat dissipation or high weight of the resulting enclosure. Current servers typically produce about 100 to 1000 watts of waste heat energy that must be dissipated in order to avoid overheating. Current servers are extremely vulnerable to natural disasters such as fires, floods, water damage and building collapse. Due to the wide variety of servers and server uses, there are hundreds of models available to perform both generic and task specific functions to modify, store or create useful data. A generic solution that can disaster proof a typical server yet manage the heat generation and minimize the cost of the total solution is clearly needed in the marketplace.

Previous designs have protected the stored data, but are not sufficient to protect the server device itself from being compromised during the disaster event. The water based fireproof insulation, such as gypsum or Portland cement, typically keeps the server environment cool to around 250° F. or 300° F. in a 2000° F. fire. Typical computer server devices can be safely stored or operate at around 160° F. without damage and subjecting the server to 200° F. or 300° F. can often damage the server as many components, especially the plastic components, cannot withstand excessive temperatures. Fireproof insulation formulas such as wax-based insulation or other endothermic chemical compounds used in the prior art that are designed to keep low temperatures during a fire may accidentally trigger an irreversible, one-time, endothermic reaction at temperatures lower than 200° F. The problem that arises for sensitive insulation during elevated shipping transportation temperatures or even normal usage in an elevated temperature environment, is that the insulation may be accidentally triggered to react without the end user's knowledge rendering the fire protection useless but undetected! In other words, if the insulation trigger temperature and the shipping/storage temperature are both 160° F. or close to 160° F., insufficient margin exists to prevent an accidental trigger of the endothermic insulation while still providing adequate temperatures during a fire disaster.

The prior art teaches one way of placing servers contained within the fireproof walls with refrigeration-heat exchanger systems such as Knieriem U.S. Pat. No. 6,632,995. By adding a refrigeration system to the fireproof cabinet, the system resolves the heat dissipation issue from the servers contained inside the enclosure while permitting the use of fireproof insulation that has sufficient margin over accidental endothermic reactions during shipping or storage. The repercussions from these design configurations is that the refrigeration unit must add essentially an equal amount of cooling power to the servers that produce a given amount of heat energy. In other words, the refrigeration unit must extract 1000 W of energy if the server requires 1000 W of power to operate. Combined with the typical inefficiencies of refrigeration, it is required that the resultant combination must use 2500 W of energy to protect a server that requires 1000 W of power!

In addition to the power penalty the prior art requires to operate, the refrigeration unit requires additional complexity, cost and weight that makes such systems
impractical for all but the largest businesses and government data storage installations.

BRIEF SUMMARY OF INVENTION

The present invention provides a novel cold thermal storage device that is utilized to cool the server when an external fire event is sensed.

The present invention represents a significant improvement over prior art in the reduction of cost to manufacture, efficiency, reduction of weight and improved reliability. By adding additional server cooling devices components such as thermoelectric coolers (Peltier coolers) to the airflow cooling present in the prior art, the present invention can improve system cooling by 30%—enough to allow the entire server to be packaged inside a air-cooled, waterproof fireproof enclosure already known in the prior art and operate at normal temperatures. In addition, a new low temperature thermal storage element can also be added to the fireproof waterproof enclosure (with airflow) that can maintain survivable temperatures during a fire that the server would require to be unaffected by the fire outside the enclosure. This new thermal storage device could exist as essentially a large chunk of ice or "frozen water cold storage battery" that is only exposed to the server within the enclosure upon sensing a fire event on the exterior. The cold thermal storage device could have many forms that include but are not limited to a frozen liquid, liquid gas under pressure or an insulated endothermic reactive substance that is triggered to cool the contents of the fireproof enclosure down to below 160° F. or temperatures that are easily survivable for the server.

The present invention can also provide for a 70% reduced cost of manufacture relative to the prior art due to the absence of refrigeration cycle components and decreased maximum internal temperature in the event of a fire and decreased maximum temperature during normal operation.

Possible cold thermal storage device architectures could include but would not be limited to: a frozen liquid or gas, a liquefied gas under pressure, a set of materials kept separated by a barrier that when allowed to combine create an endothermic reaction, such as, but not exclusively, water and ammonium nitrate. Obviously any combination of the above mentioned components could be employed to provide sufficient cooling during a fire event. The server protection device can also include protection provisions for encryption, crush, shock and drop to further protect the server device components from damage or loss. Elastomeric supports or bumpers can be added to either the outside or inside of the device to help protect shock-sensitive data media (like rotating mechanical hard drives) from damage. The fire protection of the cooling vent doors can exist in many forms. A simple fireproof door, spring and meltable trigger can be used as shown in prior art. An intumescent (expanding char or foam) could be used to also protect the cooling vent doors of the server protection device. The opening could also be sized to prevent damaging heat from touching the exposed side but relying on the steam action from the fireproof insulation continuously outgassing to form a barrier against the fire. Hard wired connections are provided through the fireproof enclosure by fire proof pass thru (as disclosed in the prior art).

A multitude of cooling vent combined with waterproofing techniques could also be applied to improve cooling during normal operation yet allow for protection during fire, flood, hurricane or water exposure.

The waterproof barrier combined with a server cooling device is an element of the design. The waterproof barrier is critical as almost all fires have a potential for water damage from fire hoses or fire sprinklers typically present in most commercial buildings. Allowing the waterproof barrier to dissipate heat from the fireproof enclosure air flow is also a critical element of the design. Hard wire connections are made thru a waterproof pass thru connection. The server retains a reasonable level of physical protection if it remains waterproof and optionally crush, shock and drop proof. The waterproof barrier though creates a problem with the efficiency of heat as it is created from the server and then slightly impeded from passing through the walls of the waterproof barrier. The server cooling device is added as a key feature to offset the inefficiencies created by adding the waterproof layer. The server cooling device could exist in many forms including a low cost Peltier thermoelectric device or any small heat exchanger/refrigeration system known in the prior art. The critical difference for this invention is that the server cooling device is located INSIDE not OUTSIDE of the fireproof enclosure as in the prior art. The waste heat of the server cooling device is carried out of the enclosure from the low cost airflow methods throughout the fireproof enclosure. By simply exhausting the heat produced within the fireproof enclosure by the server and server cooling device during normal operation, the invention can operate with normal, inexpensive fans and Peltier devices costing less than $ 20.00. The server cooling device allows the server to maintain a normal environmental server temperature in spite of the slight but relevant cooling inefficiencies as a result of the waterproof enclosure. The invention can save a considerable amount of cost compared to a 2500 W refrigeration unit which may cost $500. A cost savings of over 90% on materials!

Also, by using a thermal storage device, the invention can use low cost, less temperature sensitive insulations such as gypsum or Portland cement yet at the same time provide a low temperature survivable environment for the server during the most critical part of the fire event when the temperatures may peak.

The invention excels in energy efficiency compared with the prior art. The expected total energy required by this invention to manage 1000 W of server will only add a total of less than 200 W. In other words, 1200 W is required by this invention compared to 2500 W required to protect, run and cool the same server with refrigeration architecture. A power savings of more than 50% which compounds monthly with each energy bill!

DETAILED DESCRIPTION OF DRAWINGS

Figure 1:
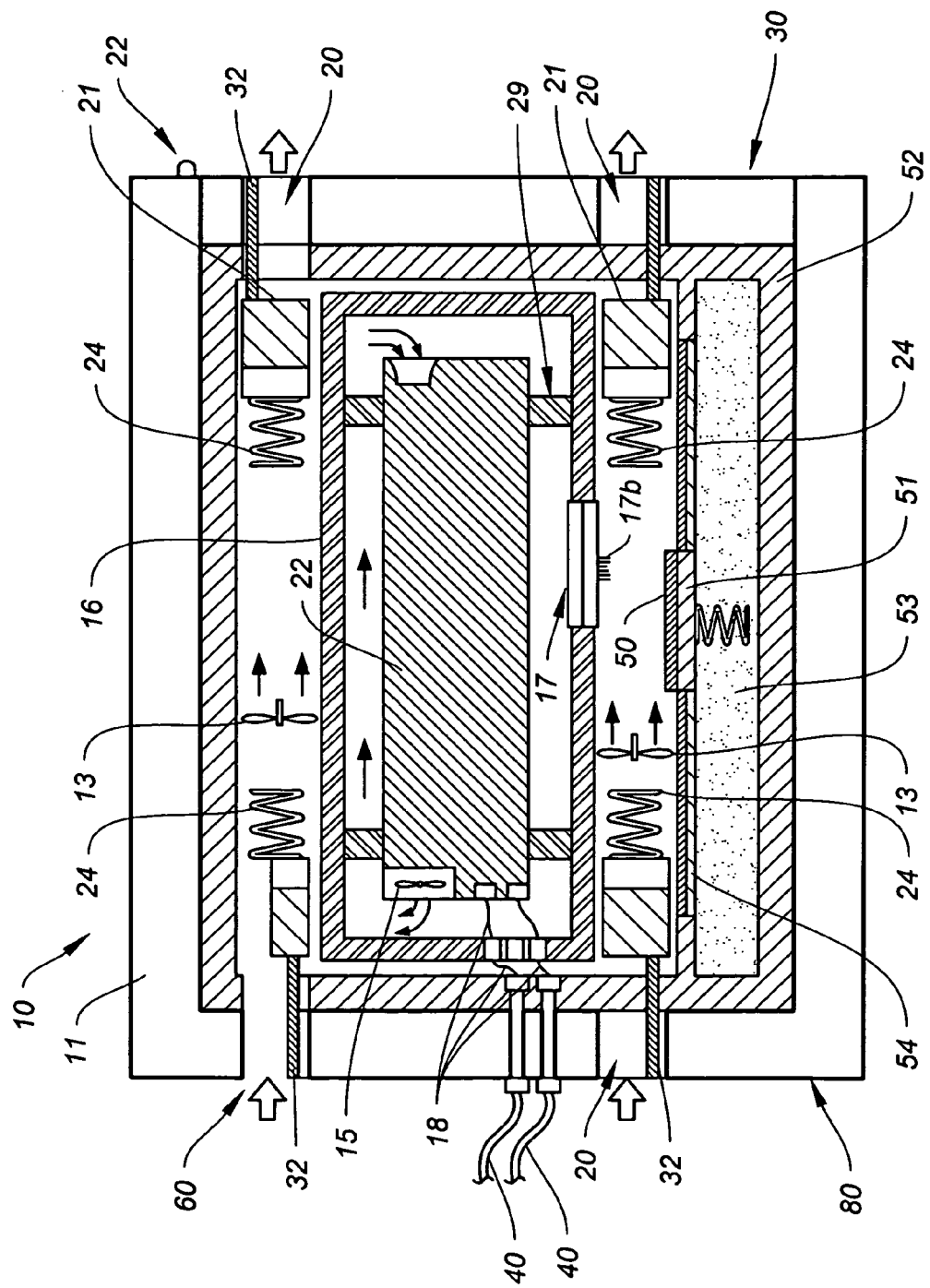
FIG. 1 is a schematic illustration of a server enclosure of the present invention.

FIG. 1 is a schematic illustration, not to scale, of a fire resistant outer server enclosure 10 with door 30. Door 30 is designed to open to allow easy access, and installation of server 22. Cooling vents 20 are formed in door 30 to allow airflow during normal use. Fire protection is enabled by meltable trigger 32 and spring closure mechanism 24 to automatically sense a fire and close the vents 20 with plugs 21. The door, trigger, spring combination can be effectively accomplished with solenoids, intumescent doors and/or tuned exhaust port designs as disclosed in the prior art. The door 30 can also be designed as one or two sliding doors (not shown)

instead of a hinged door pivotally mounted to hinge 22 as shown. The ventilation and fire sensing ability of the door & enclosure design can take many forms (e.g. hinged doors, dual sliding doors, virtual steam outgassing doors, intumescent doors, etc.).

The fireproof server enclosure 10 can be a metal or plastic enclosure filled with fire resistant or fireproof material, such as gypsum, fireproof wool, endothermic fireproof insulation or concrete 11. Server enclosure 10 may have front and rear walls in which ventilation openings 20 may be formed along with fans or ventilation means 13 for providing cooling air for the server or other vulnerable device 22. Interior walls of fireproof server enclosure 10 may have rails, slides or features (not shown) to allow for engagement with waterproof server enclosure 16 to improve serviceability of the server 22.

Alternatively, the fire resistant outer server enclosure 10 could be substituted with a non-fireproof enclosure 10 to save money or weight. The device would retain the waterproof, crush and shock described herein without the fireproof protection as a feature of the server enclosure 10. If the server enclosure 10 is designed to not resist fires, insulation, endothermic material, spring 24 and trigger 32, can all be omitted to save even more money on the total cost of goods of this device. The server device 22 would still operate as shown in FIG. 1 by connecting to any network via an adapter cable and power supplied by cables 40.

Optional elastomeric bumpers 29 can be incorporated to improve shock resistance for shock sensitive server component 22 such as mechanical hard disk drives. Solid state drives are less susceptible to shock and therefore may not be in need of any elastomeric features. Flexible bumpers can exist on the inner (as shown) or outer surfaces (not shown) of the water barrier 16.

The typical server 22 has forced air flow from a dedicated fan or blower 15 to cool the server components. The airflow provided by the fan 15 is allowed to circulate within the waterproof thermally conductive inner container or enclosure 16. Server 22 is mounted within water resistant container 16. The majority of the heat created by the server and transferred through the walls of the inner container enclosure 16 is due to the low heat resistive aspects of the enclosure 16 made from aluminum or similarly conductive metal alloy. There is a slight inefficiency and resistance to the flow of this heat which will create a thermal penalty of approximately 10° F. from the waterproof enclosure 16. This thermal penalty is offset with addition of the optional server cooling device 17 which will add just enough cooling power to the interior volume of the waterproof enclosure 16 to maintain a desired temperature. A temperature sensor, feedback circuit and controller (not shown) could be added to help regulate the cooling provided by the server cooling device 17. The server cooling device construction could be a standard thermoelectric cooler (Peltier device) with heat sink 17b. The energy from the hot side of the server cooling device 17b could be carried away in the air from the fan 13 and exhausted out the vents 20. The server cooler device is preferable a Peltier device but could also be any combination of refrigeration unit or small heat pump or common heat exchanger for transferring heat energy across a membrane or off a surface. Bulkhead mounted cables 18 will provide a conduit for the power and data lines 40 to pass through the waterproof or water resistant enclosure 16 and pass through the fire resistant outer enclosure 10. A door (not shown) on the water resistant enclosure 16 is used during installation of the server.

During a fire, the outer metallic surface 80 of the outer enclosure 10 can reach 2000° F. and the inner temperatures can reach well over 200° F. or 300° F. which can damage sensitive server electronics 22 typically rated to only withstand 150° F. To maintain a low inner temperature, methods in the prior art include sophisticated refrigeration units, or sensitive endothermic wax or salt based insulation compounds that are designed for lower temperatures. There are numerous problems with methods in the prior art in that they don't adequately address the cost, and thermal issues of a heat producing server 22 combined with the sensitivity of a low temperature triggered insulation. This invention has uses a cold thermal storage device 53 to actively lower the internal temperature of outer enclosure 10 during a fire event down to below 150° F. without the sensitivities of exotic endothermic insulations or complexities of refrigeration units and completely sealed outer enclosures. Cold Thermal storage device 53 is mounted within outer enclosure 20 during normal operation, as shown in FIG. 1, the cold thermal storage device 53 may consist of frozen water that is kept frozen with cooler device 54 which could be a Peltier devices or any small heat exchanger to help maintain a frozen state or extremely cold temperature in the cold thermal storage device 53. The inefficiencies and small amount of waste heat created by the cooling device 54 could be carried off and exhausted by the fans 13 out the vents 20. The frozen water or ice is shown inside a highly insulated and movable layer 52 to maintain its frozen state and the insulated inner door 51 is kept closed during normal usage. The thermally reactive or thermal sensing door trigger 50 is a sensing means for sensing the presence of fire outside outer enclosure 10 and is kept closed during normal operation while normal temperatures are sensed both inside or outside the enclosure. Any number of means of temperature sensing could be deployed such as actuators, springs, bi-metallic strips, thermocouples (all not shown) but this is not the point of the invention. A main aspect of the design is that a "negative energy battery" or cold thermal storage device 53 in a sense is ready to be deployed to provide required extra cooling during a fire event. The endothermic properties of the cold thermal storage device 53 will allow the server to stay actively cooler at just the right moment better than typical fire safe or even data fire safe design passive cooling effects.

If the natural disaster event consists of some kind of water damage or flooding, the server is automatically protected due to the inherent design protection of the water resistant enclosure 16. Muddy, fresh or salt water will be allowed to flow through the vents openings 20 yet not damage the server 22. The enclosure 16 could also be designed to protect against fuel, corrosive fluids or gases as well. Humidity sensors and controllers within the enclosure 16 are not shown but could also be incorporated to help further control the environment within the enclosure 16.

Figure 2:
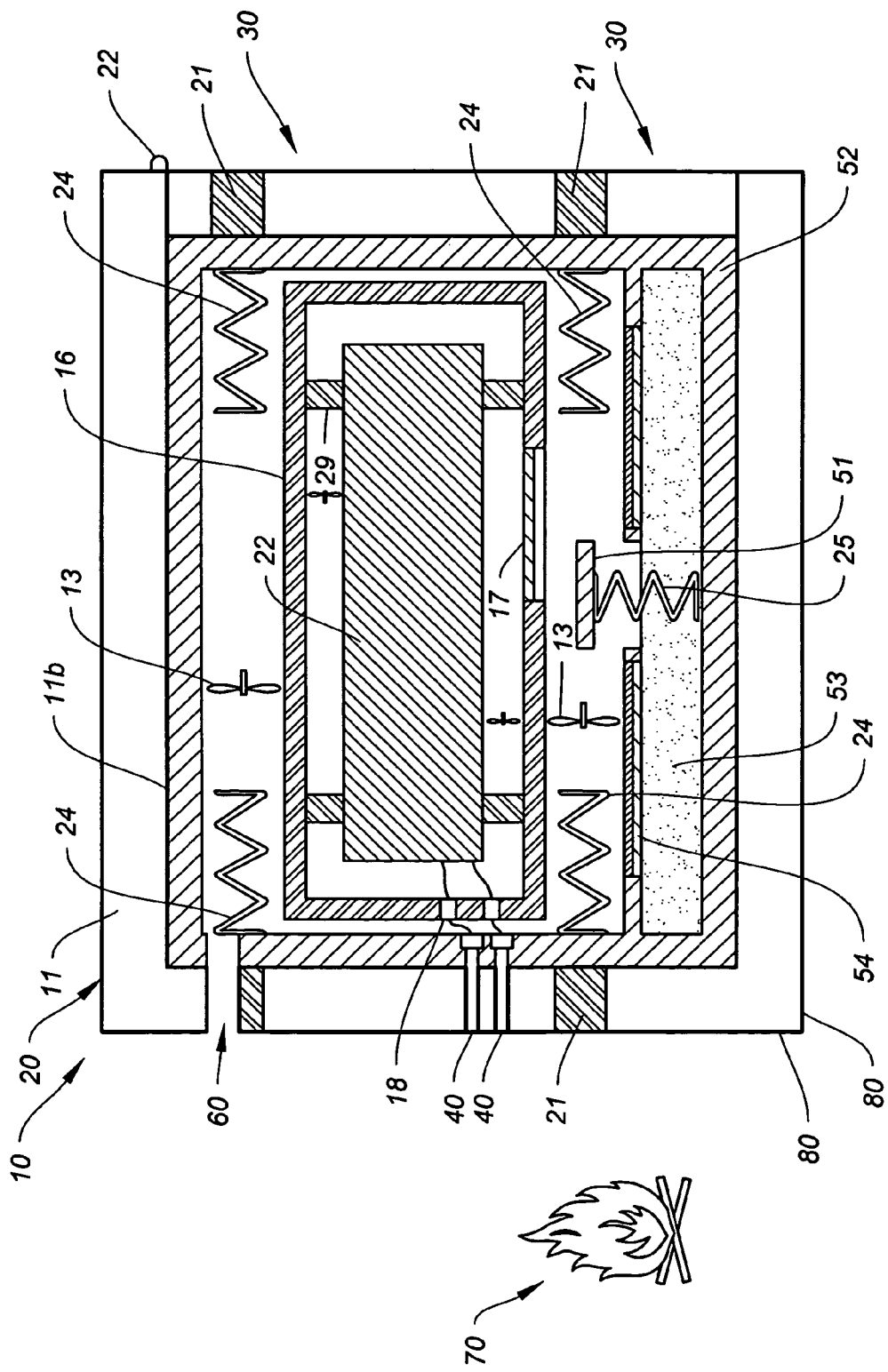
FIG. 2 illustrates the server enclosure of FIG. 1 after it has been exposed to a fire occurring outside the enclosure.

FIG. 2 is a schematic drawing, not to scale of the invention in fire safe mode after a fire 70 has been sensed outside enclosure 10. Sensing means (or triggers) 32 and 50 sense the presence of fire 70 outside outer enclosure 20, and melt in the presence of fire. As sensing means 32 and 50 melt, vent springs 24 close vents 20, but leave a small opening 60. Actuation means or spring 25 expands in the presence of fire to open movable inner door 51 upwardly, allowing cold thermal storage device 53 to be in thermal contact with container 16, allowing cold thermal storage device 53 to cool the interior of the outer enclosure 10 and to absorb unwanted heat from the interior of enclosure 20 and from water resistant container 16. Movable door 51 has a first, closed position shown in FIG. 1 in which it prevents thermal transfer between water resistant container 16 and cold thermal storage device 53. Movable door 51 has a second, open position shown in FIG. 2 in which heat is transferred from water resistant container 16 to cold thermal storage device 53. The invention is shown with the sensing means 32 and 50 melted. and Vents 20 close as a result of the fire event 70 as plugs 21 are moved to their closed position in FIG. 2 by springs 24. All external power cords and data cords 40 have been melted or severed during the fire event. Forced airflow has stopped as the fans have all lost power and are not needed during this phase. The primary insulation layer 11 has begun its endothermic reaction due to the high temperature of the fire 70. The temperature typical of the inner surface 116 of the primary insulation 11 is close to the boiling point of water 212° F. especially if the small optimized vent 60 remains open to depressurize the inner chamber and the insulation 11 is a water based insulation like gypsum or Portland cement. 212° F. is unfortunately too hot for many server devices to survive completely intact. To resolve this issue, the cold thermal storage device 53 combined with the inner insulation layer 52 is used to reduce the internal temperature down to less than 150° F. which is easily survivable for most server devices 22. Inner insulation layer 52 surrounds cold thermal storage device 53. When the fire is sensed, the outer vents 20 are closed and the inner door 51 opens when the temperature of the server 22 begins to rise beyond acceptable levels. The cooling effects from the thermal storage device 53 is felt by the server 22 through the walls of the waterproof enclosure 16. The server cooling device 17 is not needed at this time as its waste heat energy would only serve to elevate the overall temperature of the internal chamber. Optional elastomeric bumpers 29 are added to help the server survive shock due to building collapse or drops. Water resistant container 16 is preferably made to be of a very high strength to survive crush and impact loads. Alternatively, the door 51 could be eliminated if the cooling device 54 is designed to simply transfer the cold energy from the thermal storage device 53 to the interior of the waterproof inner enclosure 16 during fire protection mode.

It is also significant to note that the fan 13 illustrated in the embodiment of FIG. 1 is optional and that alternatives to the vents 20 may be provided in the front, rear, bottom or side walls (not shown) to allow cooling. The entire server enclosure 10 may also be installed within a typical server rack and take advantage of forced air flow already present in the server rack in which this device is mounted (not shown).

Cooling air flowing around the outside of enclosure 20 may also provide sufficient cooling from additional fans present in a server rack (not shown) in which this device is mounted. Cooling air from simply leaving the door 30 open during normal operation and closed in a fire would also be advantageous. Only with the addition of the server cooling device 17 is the convenience, viability and protection level reached for this invention as now the enclosure can be loaded with any commercially available computer storage device or server.

Figure 3:
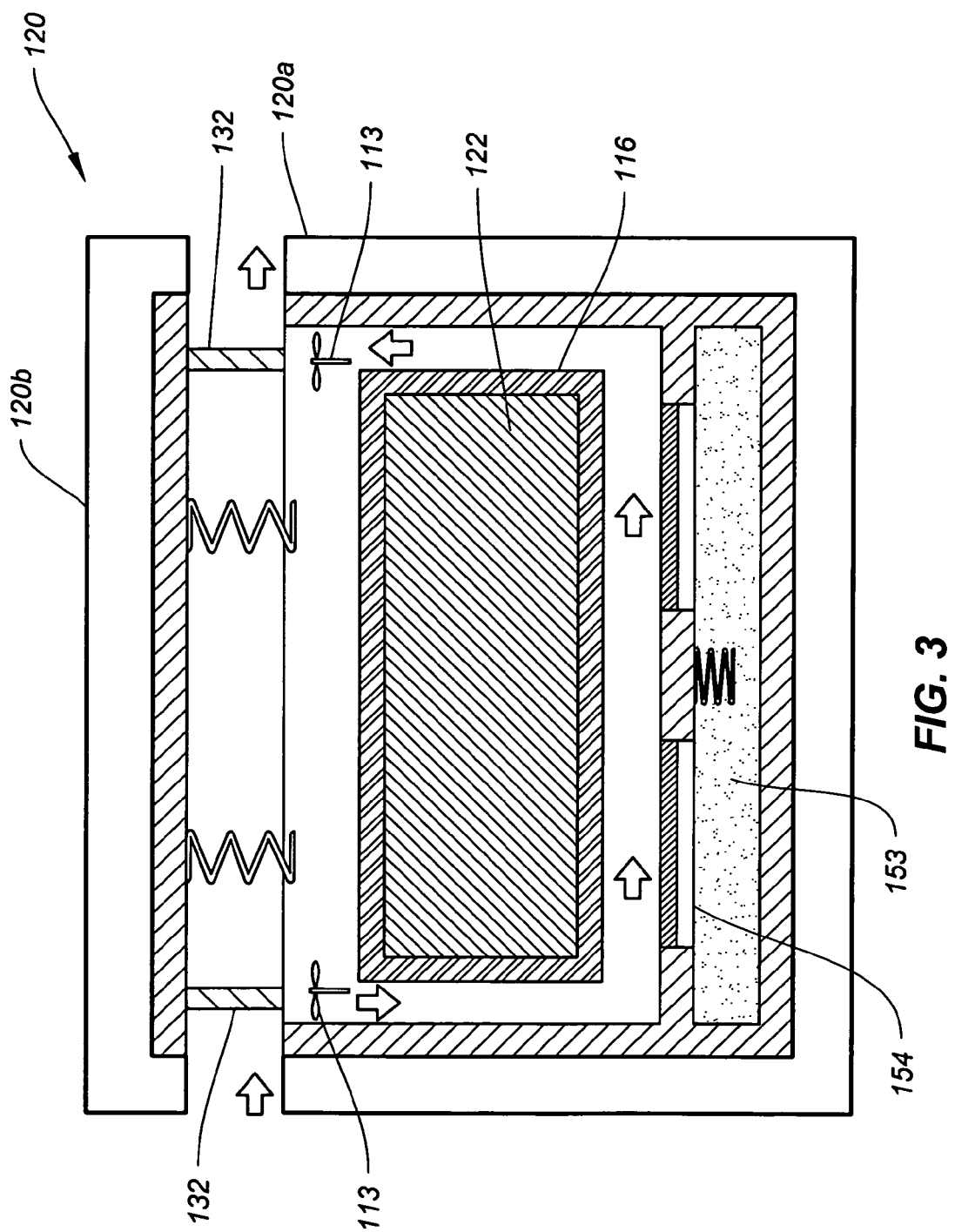
FIG. 3 illustrates an alternate embodiment of the invention utilizing a spring loaded top lid.

FIG. 3 shows an alternate configuration wherein outer enclosure 120 has a base 120b and spring loaded top lid 120c that can allow for airflow and closure by the melting of sensing means 132 during a disaster event. Side doors, front doors and/or sliding doors can all be incorporated into both the primary door or vent doors (not shown) but this is not material to the primary aspects of this invention.

Figure 4:
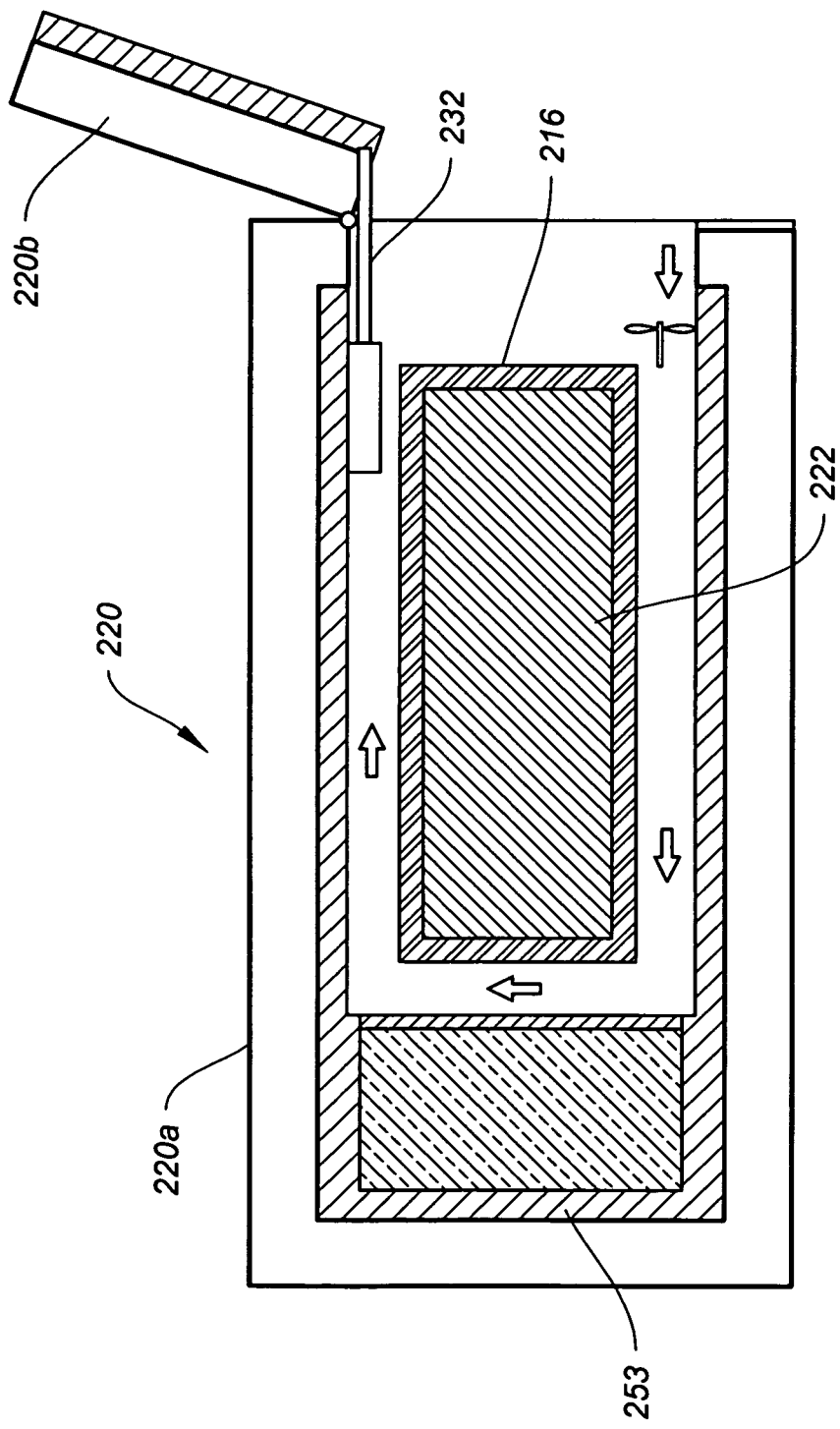
FIG. 4 illustrates a further embodiment using a hinged side access door.

FIG. 4 shows an embodiment wherein fire resistant outer enclosure 220 has a body portion 220a and a hinged side door 220b (similar to the hinged side door of FIG. 1). Side door 220b provides access to server 222 and water resistant container 216.

Cold thermal storage device 253 is positioned to the side of water resistant container 216. It is to be understood that cold thermal storage device 253 can be placed above, below, or alongside water resistant container 216.

The management of heat, both externally produced as during a fire and internally produced during normal operation are primary to this invention. Applicants believe that cold thermal storage devices and server cooling devices have not previously been combined with fireproof waterproof enclosures, airflow and standard data storage servers to produce a simple, low cost, disaster resistant server enclosure disclosed in this invention. The cold thermal storage device and server cooling device may also be configured to be used independently as the particular design requires. This invention will have a measurable impact by reducing the cost and the vulnerability of data storage—the vast majority of which sits at risk of lost on servers everywhere.

The foregoing description of the invention has been presented for purposes of illustration and description and is not intended to be exhaustive or to limit the invention to the precise forms disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated.

The invention claimed is:

1. A disaster resistant server comprising:
   a fire resistant outer enclosure
   a water resistant, thermally conductive container mounted within said outer enclosure
   a server mounted within said water resistant container
   an insulated cold thermal storage device mounted within said outer enclosure
   ventilation means for driving air flow through said enclosure
   sensing means for sensing the presence of fire outside of said outer enclosure, and
   actuation means acting in response to said sensing means for allowing said cold thermal storage device to cool the interior of said outer enclosure during a fire, wherein said actuation means comprises
   a movable door having a first, closed position in which it prevents thermal transfer between said water resistant container and said cold thermal storage device, and a second, open position in which heat is transferred from said water resistant container to said cold thermal storage device, and
   door actuation means for moving said door from said first, closed position to said second, open position in the presence of said fire.

2. The apparatus of claim 1 wherein said door actuation means comprises a spring that expands in the presence of said fire.

3. The apparatus of claim 1 wherein said thermal storage device comprises ice, and said door actuation means will not open said door below 150° F.

* * * * *